(12) United States Patent
Leddige et al.

(10) Patent No.: US 6,362,973 B1
(45) Date of Patent: Mar. 26, 2002

(54) MULTILAYER PRINTED CIRCUIT BOARD WITH PLACEBO VIAS FOR CONTROLLING INTERCONNECT SKEW

(75) Inventors: Michael W. Leddige, Beaverton; Bryce D. Horine, Aloha, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/524,627

(22) Filed: Mar. 14, 2000

(51) Int. Cl.[7] .............................. H05K 1/02; H05K 1/14
(52) U.S. Cl. ........................ 361/762; 361/772; 333/32; 333/246; 174/266; 174/255
(58) Field of Search ................................ 361/762, 736, 361/748, 661, 684, 781, 794; 174/260, 261, 262, 264, 266, 255; 333/32, 33, 34, 246, 247

(56) References Cited

U.S. PATENT DOCUMENTS

| | | | |
|---|---|---|---|
| 3,033,914 A | | 5/1962 | Acosta-Lleras |
| 3,398,232 A | | 8/1968 | Hoffman |
| 4,361,634 A | * | 11/1982 | Miller ............................ 430/5 |
| 5,272,600 A | | 12/1993 | Carey |
| 5,578,940 A | | 11/1996 | Dillon et al. |
| 5,663,661 A | | 9/1997 | Dillon et al. |
| 5,686,730 A | * | 11/1997 | Laudon et al. ................. 365/52 |
| 5,764,489 A | | 6/1998 | Leigh et al. |
| 5,768,109 A | * | 6/1998 | Gulick et al. ................. 361/794 |
| 6,021,076 A | | 2/2000 | Woo et al. |
| 6,034,878 A | * | 3/2000 | Osaka et al. ................... 365/52 |
| 6,067,594 A | | 5/2000 | Perino et al. |
| 6,137,064 A | * | 10/2000 | Kiani et al. ................... 174/266 |
| 6,137,709 A | * | 10/2000 | Boaz et al. .................... 365/51 |
| 6,145,123 A | * | 11/2000 | Torrey et al. ................... 717/4 |
| 6,160,716 A | | 12/2000 | Perino et al. |

OTHER PUBLICATIONS

US Patent Application "Via Pad Geometry Supporting Uniform Transmission Line Structures", Inventors Michael Leddige and John Sprietsma—08/959,244 Filed Oct. 28, 1997–042390.P4613.

* cited by examiner

Primary Examiner—Jayprakash N. Gandhi
Assistant Examiner—Hung Bui
(74) Attorney, Agent, or Firm—Mark V. Seeley

(57) ABSTRACT

A multi-layer printed circuit board that includes a first layer and a second layer that have first and second signal traces, respectively. The multi-layer printed circuit board includes a via that couples a signal transmitting component to the second signal trace and a throttling member, which is coupled to the first signal trace. The throttling member reduces the speed at which a first signal routed over the first signal trace travels when compared to the speed at which that signal would have traveled had the throttling member been absent.

14 Claims, 2 Drawing Sheets

MULTILAYER PRINTED CIRCUIT BOARD WITH PLACEBO VIAS FOR CONTROLLING INTERCONNECT SKEW

FIELD OF THE INVENTION

The present invention relates to electrical interconnects for printed circuit boards.

BACKGROUND OF THE INVENTION

When the space available for signal traces on printed circuit boards ("PCBs") is limited, signal lines for connecting components may have to be routed along more than one PCB layer. Some of those signal lines may run along the surface of the PCB. Others, as shown in FIG. 1, may run from a signal transmitting component (represented by line 1), which is mounted onto first layer 2 of PCB 10, through via 9 to signal trace 4, which runs along second layer 5. Via 9's inductance and capacitance characteristics introduce a time delay. As 15 a consequence, signals driven along the surface of PCB 10 are skewed with respect to signals routed through via 9 and signal trace 4. For source synchronous interconnects, such skew may result when clock and data signals (or consecutive data signals) take different paths across the PCB.

Although this may be a third or fourth order effect for relatively low speed interconnects, such skew can effectively limit the maximum frequency at which high speed, pipelined electrical signals may be driven along a high speed interconnect. Take, for example, the Direct Rambus memory channel, which a PCB may include for transmitting 300 MHz, or higher, clock signals, in a pipelined fashion, between a memory controller and a memory module. (Because data is taken off both the falling and rising edges of the clock signal, the data transfer rate may be 600M transfers, or more.) For PCBs having two RIMMS, the Direct Rambus memory channel can require signals to pass through 6 vias—2 each located between the memory controller and the first RIMM, between the two RIMMs, and between the second RIMM and the termination resistor. (One via routes signals from the transmitting component to a second PCB layer, and another via routes signals from that layer to the component that will receive the signals.) When signals that are transmitted between two components must pass through multiple vias, the timing skew that accumulates over the length of the connection, resulting from the additive effect of the time delay that each via generates, may limit the frequency at which the interconnect may operate.

Accordingly, there is a need for an improved interconnect for a printed circuit board. There is a need for such an interconnect to reduce skew between signals driven along a PCB layer and signals driven along at least two PCB layers that are connected by a via. The present invention provides such an interconnect.

DETAILED DESCRIPTION OF THE PRESENT INVENTION

A multi-layer printed circuit board is described. That circuit board includes first and second layers that include first and second signal traces, respectively. The multi-layer printed circuit board includes a via that couples a signal transmitting component to the second signal trace and a throttling member that is coupled to the first signal trace. The throttling member ensures that a signal routed over the first signal trace will travel at a reduced speed, when compared to the speed at which that signal would have traveled had the throttling member been absent.

Figure 1:
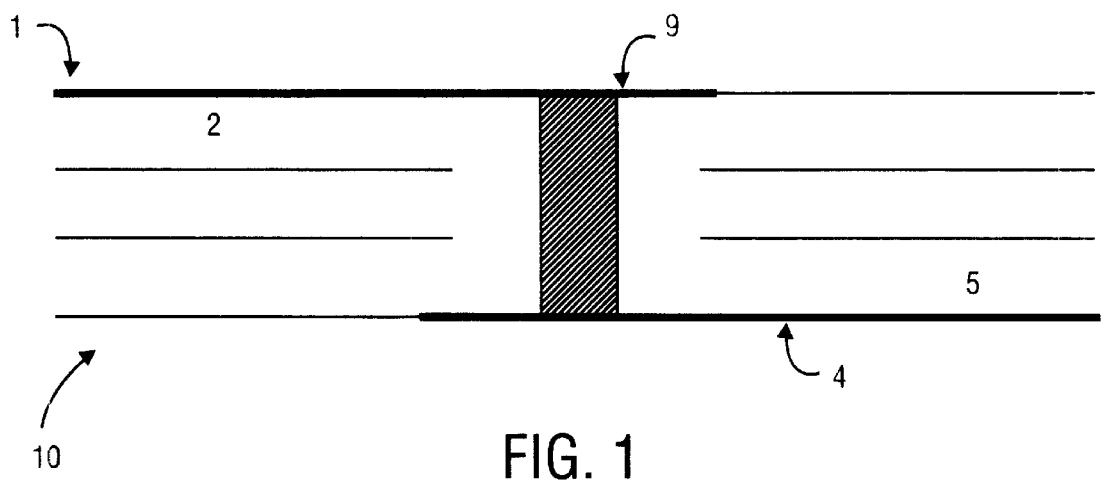
FIG. 1 represents a cross-section of a four layer PCB that routes signals from a signal transmitting component located on one of the layers to a signal trace located on another layer.

A number of embodiments of the present invention are described below with reference to FIGS. 1–3. In the following description, numerous specific details are set forth such as component types, dimensions, etc., to provide a thorough understanding of the present invention. However, it will be apparent to those skilled in the art that the invention may be practiced in many ways other than those expressly described here. The invention is thus not limited by the specific details disclosed below.

Clock and data signals may be transmitted across a PCB from one component to another along a first signal trace formed on the top layer of the PCB. Alternatively, such signals may pass from a signal transmitting component (such as a memory controller or RIMM), through a via, then along a second trace formed on a second PCB layer. In that alternative route, the via's inductance and capacitance characteristics introduce a time delay. As a consequence, signals driven from one component to another along the surface of the PCB are skewed with respect to signals routed between those components by way of the via and second signal trace. The via may introduce a time delay of 15 picoseconds or more. Such skew can impact the performance of signals transmitted over a high speed, pipelined interconnect. In the extreme case, skew that causes data to arrive too late or too early can cause either a setup or hold violation.

Figure 2A:
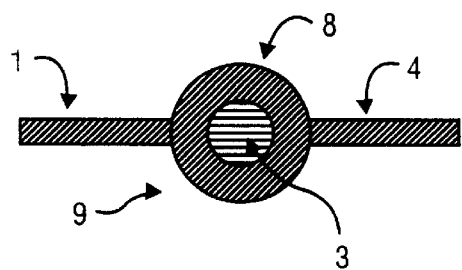
FIG. 2a represents an overhead/transparent view of the PCB that FIG. 1 illustrates.

FIG. 2a shows signal transmitting component 1 and second signal trace 4 coupled to via 9 (as that structure would appear if signal trace 4, located on lower layer 5, could be observed from the surface of the PCB). (The term "via," as used herein, refers to the combination of shaft 3, which couples signal transmitting component 1 to signal trace 4, and pad 8, which couples component 1 to shaft 3. In embodiments that do not include such a pad, the term "via" refers to the shaft that couples signal transmitting component 1 to signal trace 4.) Signals driven from signal transmitting component 1 (e.g., a memory controller or memory card) to a second component, along a first signal trace located on the surface of layer 2, will be skewed with respect to signals driven through via 9 and over second signal trace 4.

Figure 2B:
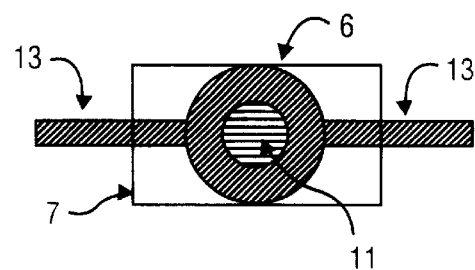
FIG. 2b represents an overhead view of an embodiment of the present invention in which a signal trace, which routes signals between two components along a single PCB layer, is coupled to a placebo via that has an oversized via pad.

To address this problem, the present invention relies upon a throttling member to reduce the speed at which a signal routed over the first signal trace travels when compared to the speed at which it would have traveled had the throttling member been absent. In the embodiment shown in FIG. 2b, the throttling member comprises placebo via 6 that is coupled to first signal trace 13. Like via 9, placebo via 6 includes via pad 7 and shaft 11. Although signals passing across via pad 7 will not pass through shaft 11, shaft 11 may contribute, to some extent, to via 6's capacitance. Placebo via 6 causes a first signal routed over first signal trace 13 to have timing characteristics that are more closely matched to those of a second signal routed from signal transmitting component 1, through via 9, and over second signal trace 4, than they would have been had placebo via 6 not been coupled to first signal trace 13. (Unlike the structure that FIG. 2a illustrates, trace 13—of the structure that FIG. 2b depicts—runs along the top layer of the PCB on both sides of via pad 7.)

Although placebo via 6 may have a size and shape like that of via 9, skew may not be completely eliminated by routing a signal over a similarly sized placebo via. For example, when an unmodified device generates 15 picoseconds of skew, then adding a placebo via, which has a surface area similar to that of via 9, may reduce skew to about 5 picoseconds. To substantially eliminate skew, pad 7 of placebo via 6 should have a surface area that exceeds the surface area of pad 83 of via 9 by an appropriate amount. Preferably, via pad 7's surface area, relative to via pad 8's surface area, should be selected such that the skew between a signal routed over first signal trace 13 and a signal routed from signal transmitting component 1, through via 9, and over second signal trace 4 will be less than 2 or 3 picoseconds. In a most preferred embodiment, a surface area is selected for the placebo via such that the speed at which a first signal travels over first signal trace 13 and through via pad 7 is substantially equal to the speed at which a second signal travels from signal transmitting component 1, through via 9, and over second signal trace 4. A placebo via having a via pad 7 with a surface area that is approximately double the surface area of via pad 8 may yield this desirable result.

Figure 3:
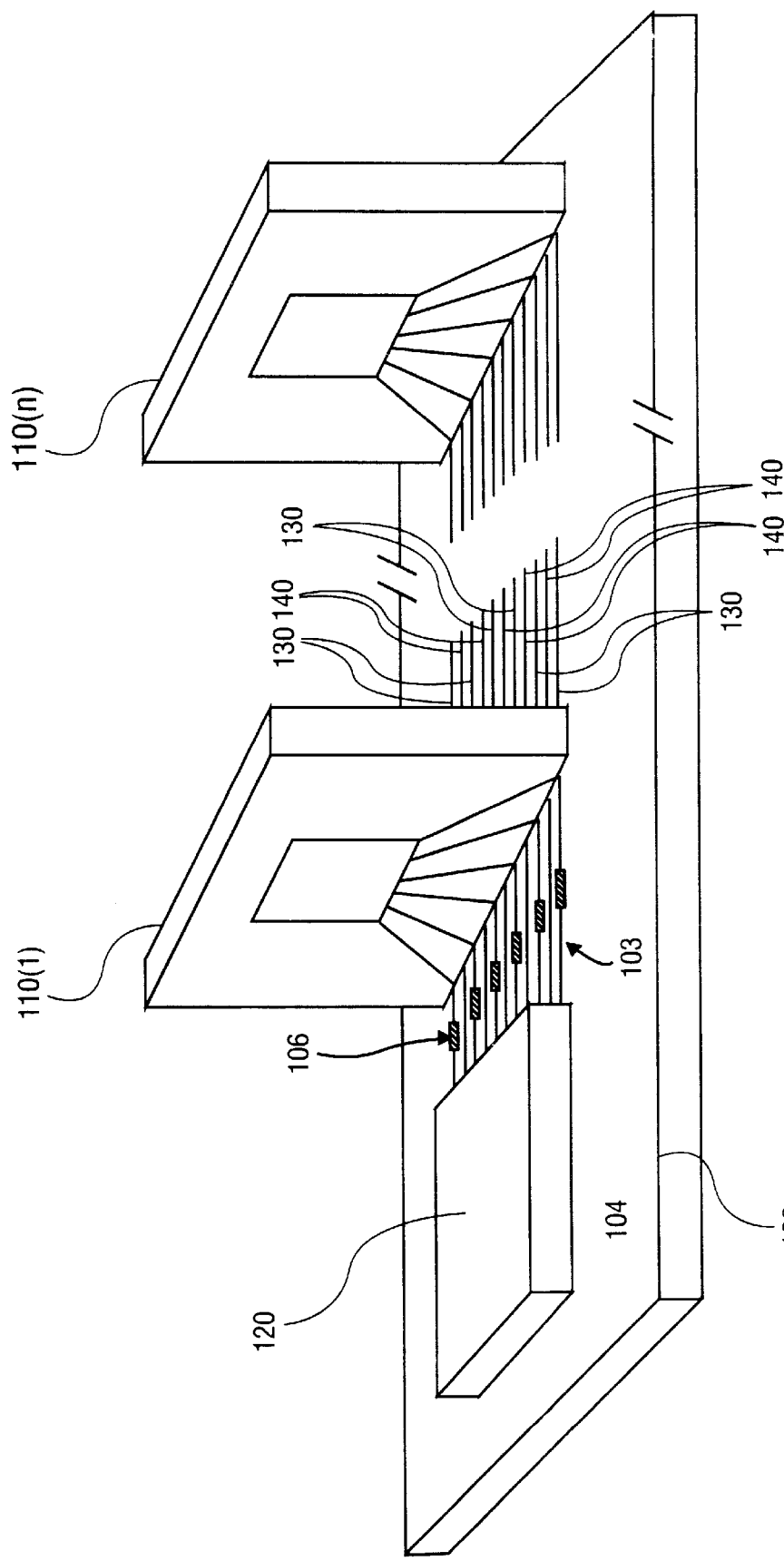
FIG. 3 illustrates an embodiment of the present invention as implemented in a motherboard.

FIG. 3 illustrates an embodiment of the present invention as implemented in a motherboard. Mounted onto motherboard 100 are memory controller 120 and memory modules 110(1)–110(n). Memory modules 110(1)–110(n) may comprise high speed DRAMs, e.g., those having an architecture developed by Rambus Corporation of Mountain View, California, which are generally designated Rambus DRAMS or RDRAMs. Such RDRAMs may be capable of transmitting and receiving clock signals at a frequency of 300 MHz or higher (for a data transfer rate of 600M transfers or more).

Motherboard 100 supports interconnect 103. A first portion of interconnect 103 is located on first layer 104. That first portion of interconnect 103 includes several signal traces 130 and several reference traces 140. A second portion of interconnect 103 is located on a second layer (not shown). That second portion of interconnect 103 also includes several signal and reference traces. Vias couple memory controller 120 and memory cards (e.g., RIMMs) 110(1)–110(n) to signal traces located on the second layer. Placebo vias 106 are coupled to signal traces 130. Signal traces 130 enable signals to be transmitted directly between memory controller 120 and memory cards 110(1)–110(n) without being transferred through vias to signal traces located on the second layer. The presence of placebo vias 106 reduces skew between (1) signals routed along the surface of layer 104 between memory controller 120 and memory cards 110(1)–110(n), and (2) signals routed between those components by way of vias and signal traces located on another PCB layer. As mentioned above, by using an oversized via pad for the placebo via, the delay that the vias introduce may be closely matched to the delay that placebo vias 106 cause.

Motherboard 100 may comprise a four layer board in which signal traces may be formed on the motherboard's outer layers, while power and ground planes may reside on layers located between the signal layers. Alternatively, in such a four layer board, the signal layers may be located on the interior layers and the power and ground planes located on the outer layers. In that alternative embodiment, placebo vias may be located on signal traces that are formed on one of those interior layers. Such placebo vias may reduce skew between signals that pass through that interior layer from one component to another, and other signals exchanged between those components, which instead pass from that interior layer, through a via, to the other interior layer. In other embodiments, motherboard 100 may comprise more than four layers. For an eight layer board, for example, layers may be stacked in the following order: signal layer, ground plane, signal layer, power plane, ground plane, signal layer, ground plane, signal layer.

An improved interconnect for a printed circuit board has been described. That interconnect includes a throttling member that reduces the speed at which a signal routed over a first signal trace travels when compared to the speed at which that signal would have traveled had the throttling member been absent. This may enable substantial elimination of skew between (1) a first signal routed over the first signal trace and (2) a second signal routed from a signal transmitting component located on a first PCB layer, through a via, and over a second signal trace located on another PCB layer. This invention may be particularly applicable for low impedance interconnects, e.g., interconnects having an impedance below 40 ohms.

Features shown in the above referenced drawings are not intended to be drawn to scale, nor are they intended to be shown in precise positional relationship. Additional features that may be integrated into the interconnect of the present invention have been omitted as they are not useful to describe aspects of the present invention. Although the foregoing description has specified an interconnect that includes certain features, those skilled in the art will appreciate that many modifications and substitutions may be made. For example, although represented as a rectangle in the drawings, the oversized placebo via may assume any shape. Accordingly, it is intended that all such modifications, alterations, substitutions and additions be considered to fall within the spirit and scope of the invention as defined by the appended claims.

What is claimed is:

1. A multi-layer printed circuit board comprising:
 a first layer that includes a first signal trace that is coupled to a signal transmitting component;
 a second layer that includes a second signal trace;
 a first via that couples the signal transmitting component to the second signal trace; and
 a throttling member, coupled to the first signal trace, to reduce the speed at which a signal routed over the first signal trace travels such that skew is reduced between (1) a first signal that is routed over the first signal trace from the signal transmitting component to a signal receiving component, and (2) a second signal that is routed from the signal transmitting component, through the first via, and over the second signal trace to the signal receiving component.

2. The multi-layer printed circuit board of claim 1 wherein the throttling member comprises a second via.

3. The multi-layer printed circuit board of claim 2 wherein the first via and the second via each comprise a via pad and a shaft, the via pad for the second via having a surface area that exceeds the surface area of the via pad for the first via, and wherein signals may pass over the first signal trace from one side of the second via's via pad to the other side of the second via's via pad without passing through the shaft of the second via.

4. The multi-layer printed circuit board of claim 3 wherein the via pad for the second via has a surface area that is at least about twice the surface area of the via pad for the first via.

5. The multi-layer printed circuit board of claim 3 wherein the second via enables skew between (1) a first signal that is routed over the first signal trace from the signal transmitting component to the signal receiving component, and (2) a second signal that is routed from the signal transmitting component, through the first via, and over the second signal trace to the signal receiving component, to be less than about 3 picoseconds.

6. The multi-layer printed circuit board of claim 5 wherein the second via ensures that the delay imparted by the second via to the first signal is substantially equal to the delay imparted by the first via to the second signal.

7. The multi-layer printed circuit board of claim 6 wherein the via pad for the second via is substantially rectangular in shape.

8. A multi-layer printed circuit board comprising:

a first layer that includes a first signal trace;

a second layer that includes a second signal trace;

a first via, having a via pad, that couples a signal transmitting component to the second signal trace; and a second via, coupled to the first signal trace, the second via having a via pad that has a surface area that exceeds the surface area of the via pad for the first via.

9. The multi-layer printed circuit board of claim 8 wherein the via pad for the second via has a surface area that is at least about twice the surface area of the via pad for the first via.

10. The multi-layer printed circuit board of claim 9 wherein the first and second signal traces are capable of transmitting clock signals at 300 MHz.

11. A motherboard assembly comprising:

a memory controller;

a memory module that includes a dynamic random access memory;

a first layer that includes a first signal trace, the first signal trace coupling the memory controller to the memory module;

a second layer that includes a second signal trace;

a first via that couples the memory controller to the second signal trace; and a second via, which is coupled to the first signal trace, the second via adding capacitance to the first signal trace enabling skew to be reduced between (1) a first signal that is routed from the memory controller over the first signal trace to the memory module and (2) a second signal that is routed from the memory controller, through the first via, and over the second signal trace to the memory module.

12. The motherboard assembly of claim 11 wherein the first via and the second via each comprise a via pad and a shaft, the via pad for the second via having a surface area that exceeds the surface area of the via pad for the first via, and wherein signals may pass over the first signal trace from one side of the second via's via pad to the other side of the second via's via pad without passing through the shaft of the second via.

13. The motherboard assembly of claim 12 wherein the via pad for the second via has a surface area that is at least about twice the surface area of the via pad for the first via.

14. The motherboard assembly of claim 13 wherein the second via enables skew to be substantially eliminated between (1) a first signal that is routed from the memory control over the first signal trace to the memory module and (2) a second signal that is routed from the memory controller, through the first via, and over the second signal trace to the memory module.

* * * * *

UNITED STATES PATENT AND TRADEMARK OFFICE
CERTIFICATE OF CORRECTION

PATENT NO. : 6,362,973 B1
DATED : March 26, 2002
INVENTOR(S) : Leddige et al.

It is certified that error appears in the above-identified patent and that said Letters Patent is hereby corrected as shown below:

Column 1,
Line 19, before "a consequence", delete "15".

Column 3,
Line 14, delete "83", insert -- 8 --.

Signed and Sealed this

Twenty-eighth Day of January, 2003

JAMES E. ROGAN
*Director of the United States Patent and Trademark Office*